United States Patent [19]

Fujinaka et al.

[11] Patent Number: 4,806,334
[45] Date of Patent: Feb. 21, 1989

[54] GLAZED CERAMIC SUBSTRATE

[75] Inventors: Hiroshi Fujinaka; Masami Terasawa, both of Kokubu, Japan

[73] Assignee: Kyocera Corporation, Kyoto, Japan

[21] Appl. No.: 114,227

[22] Filed: Oct. 26, 1987

Related U.S. Application Data

[62] Division of Ser. No. 834,888, Feb. 28, 1986, abandoned, which is a division of Ser. No. 775,859, Sep. 13, 1985, Pat. No. 4,632,846.

[30] Foreign Application Priority Data

| Sep. 17, 1984 | [JP] | Japan | 59-195333 |
| Sep. 21, 1984 | [JP] | Japan | 59-199133 |
| Sep. 21, 1984 | [JP] | Japan | 59-199134 |
| Sep. 27, 1984 | [JP] | Japan | 59-203175 |

[51] Int. Cl.⁴ .................................. B32B 17/06
[52] U.S. Cl. ............................ 428/631; 428/131; 428/210; 428/432; 428/663; 428/665; 428/901; 501/21; 501/70; 174/68.5
[58] Field of Search ............... 174/68.5; 428/901, 432, 428/631, 131, 210, 433, 663, 665; 501/70, 21

[56] References Cited

U.S. PATENT DOCUMENTS

| 4,012,263 | 3/1977 | Shell | 501/70 |
| 4,180,618 | 12/1979 | Alpha et al. | 501/70 |
| 4,238,705 | 12/1980 | Thomas et al. | 501/70 |
| 4,282,507 | 8/1981 | Tindall et al. | 338/28 |
| 4,396,682 | 8/1983 | Mohri et al. | 501/70 |
| 4,429,007 | 1/1984 | Bich et al. | 501/70 |
| 4,536,435 | 8/1985 | Utsumi et al. | 428/901 X |
| 4,598,167 | 7/1986 | Ushifusa et al. | 174/68.5 |
| 4,634,634 | 1/1987 | Kondo et al. | 428/901 X |
| 4,650,923 | 3/1987 | Wishigaki et al. | 174/68.5 |

*Primary Examiner*—William R. Dixon, Jr.
*Assistant Examiner*—Karl Group
*Attorney, Agent, or Firm*—Spensley Horn Jubas & Lubitz

[57] ABSTRACT

A paste of a glazing composition is coated on the entire surface of a ceramic substrate having a metallized metal portion, and the paste-coated ceramic substrate is sintered in a reducing atmosphere, and a glazing layer is formed on the entire surface of the metallized metal portion by utilizing the repellency of the melt of the glazing composition to the metallized metal portion. A glazing composition comprising $SiO_2$, $B_2O_3$, BaO, $Al_2O_3$ and an alkali metal oxide or a glazing composition comprising $SiO_2$, BaO, $Al_2O_3$, CaO and MgO or SrO is used. An acrylic resin syrup, especially an isobutyl methacrylate resin syrup, is used as a binder of a coating paste for forming a glazing layer.

4 Claims, 1 Drawing Sheet

GLAZED CERAMIC SUBSTRATE

This is a division of application Ser. No. 834,888, filed on Feb. 28, 1986, now abandoned, which in turn is a division of application Ser. No. 775,859, filed on Sept. 13, 1985, now U.S. Pat. No. 4,632,846.

BACKGROUND OF THE INVENTION (1) Field of the Invention

The present invention relates to a process for the preparation of a glazed ceramic substrate. More particularly, the present invention relates to a process for the preparation of a glazed ceramic substrate on which fine electric wiring is possible. Furthermore, the present invention relates to a glazing composition for use in carrying out this process and a paste for use in coating this glazing composition.

(2) Description of the Prior Art

A glazed ceramic substrate comprising a glazing layer of a glass melt-bonded to the surface of a ceramic substrate is widely used as a substrate on which a filmy electric wiring is formed, because the surface of this substrate is excellent in the smoothness.

This conventional glazed ceramic substrate is ordinarily prepared by coating a paste comprising a glass powder composed of $SiO_2$, $B_2O_3$, $Al_2O_3$ and the like, an appropriate solvent and an appropriate binder on the surface of a ceramic substrate composed of alumina, beryllia or the like according to the screen printing method and sintering the ceramic substrate to melt-bond the glazing paste to the ceramic substrate. A ceramic substrate having a metallized metal portion of tungsten (W), molybdenum (Mo) or the like on the surface is prepared by coating the glazing paste only on the surface of the ceramic substrate exclusive of the metallized metal portion.

However, in the case where a glazing layer is melt-bonded to a ceramic substrate having this metallized metal portion, in order to coat a glazing paste only on the surface of the ceramic substrate exclusive of the metallized metal portion, a special mask should be used for preventing the glazing paste from adhering to the metallized metal portion. Since this mask is expensive and registering of the mask with the ceramic substrate is difficult, the productivity of the glazed ceramic substrate is low and the manufacturing cost of the glazed ceramic substrate is increased.

Furthermore, the glazing paste is poor in the printability and bleeding is readily caused. Accordingly, when the glazing paste is coated and printed only in the portion exclusive of the metallized metal portion on the ceramic substrate, a certain clearance should be formed from the metallized metal portion while taking bleeding of the glazing paste into consideration.

However, bleeding of the glazing paste is irregular, and if bleeding of the glazing paste is smaller than expected, the glazing paste cannot be melt-bonded to the portion close to the periphery of the metallized metal portion on the surface of the ceramic substrate, and if a fine electric wiring is distributed in this glazing layer-free portion, breaking of the wiring is caused because of the surface roughness of the ceramic substrate and the function of the fine electric wiring substrate is completely lost.

SUMMARY OF THE INVENTION

The present invention is to overcome the abovementioned defects of the conventional technique. Namely, it is a primary object of the present invention to provide a process for preparing a cheap glazed ceramic substrate without using a special mask, in which a glazing layer can be formed on the entire surface of a ceramic substrate exclusive of the metallized metal portion by metal bonding and breaking of a fine electric wiring can be completely prevented.

Another object of the present invention is to provide a glazing composition which shows a repellency to a metallized metal layer in the molten state.

Still another object of the present invention is to provide a glazing glass composition in which blackening of a glazing layer and degradation of the electrically insulating property, which will result in loss of the function of a substrate for a fine electric wiring, are prevented even if sintering is conducted in a reducing atmosphere when the glazing layer is melt-bonded to a ceramic substrate having a metallized metal portion.

Still another object of the present invention is to provide a glazing paste which is excellent in the coating property and printability and in which blackening of a glazing layer is completely prevented even if sintering is conducted in a reducing atmosphere when the glazing layer is melt-bonded to a ceramic substrate.

In accordance with one fundamental aspect of the present invention, there is provided a process for the preparation of a glazed ceramic substrate, which comprises coating the entire surface of a ceramic substrate having a metallized metal portion with a paste of a glazing composition having a repellency to the metallized metal portion in the molten state, and sintering the paste-coated surface of the substrate in a reducing atmosphere to melt the glazing composition and cause the molten composition present on the metallized metal portion to migrate to the surface of the ceramic substrate, whereby a glazing layer is formed on the entire surface of the ceramic substrate exclusive of the metallized metal portion.

In accordance with another fundamental aspect of the present invention, there is provided a glazing composition comprising 60 to 80% by weight of $SiO_2$, 10 to 25% by weight of $B_2O_3$, 2 to 10% by weight of BaO, 0.5 to 10% by weight of $Al_2O_3$ and 1 to 15% by weight of an alkali metal oxide.

In accordance with still another fundamental aspect of the present invention, there is provided a glazing composition comprising 55 to 75% by weight of $SiO_2$, 6 to 20% by weight of BaO, 6 to 12% by weight of $Al_2O_3$, 8 to 20% by weight of CaO and 0.05 to 3% by weight of at least one oxide selected from MgO and SrO.

In accordance with still another fundamental aspect of the present invention, there is provided a coating paste for forming a glazing layer, which comprises a powdery glazing composition, a binder and a solvent, wherein the binder is an acrylic resin syrup, especially an isobutyl methacrylate resin syrup.

Figure 1:
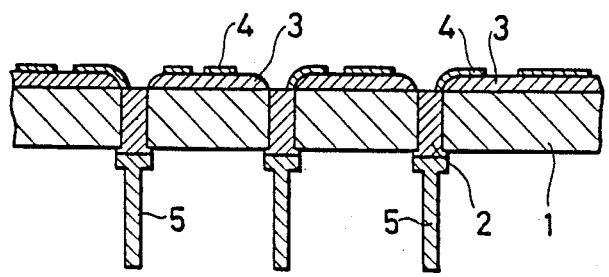
FIG. 1 is an enlarged sectional view showing a part of a glazed ceramic substrate prepared according to the process of the present invention.

In the drawings, reference numeral 1 represents a ceramic substrate, reference numeral 2 represents a metallized metal portion, reference numeral 3 represents a glazing layer, reference numeral 4 represents a fine filmy electric wiring, reference numeral 5 represents an external lead pin, and reference numeral 6 represents a paste of a glazing composition.

DETAILED DESCRIPTION OF THE PREFERRED EMBODIMENTS

The present invention will now be described in detail with reference to the accompanying drawings.

FIG. 1 is an enlarged sectional view showing a glazed ceramic substrate prepared according to the process of the present invention, in which reference numeral 1 represents a substrate composed of alumina, beryllia or other ceramic material, and reference numeral 2 represents a metallized metal portion composed of molybdenum (Mo), tungsten (W) or the like.

The ceramic substrate 1 having the metallized metal portion 2 can be prepared by incorporating an appropriate binder such as an acrylic resin or toluene and a solvent in a ceramic powder, forming the mixture into a ceramic green sheet by the doctor blade method or the calender roll method, forming through holes in the ceramic green sheet by the known punching method, printing and embedding a conductor paste formed by mixing a powder of a metal such as molybdenum (Mo) or tungsten (W) in an organic solvent into the through holes by the screen printing paste, and sintering the printed ceramic sheet.

A glazing layer 3 is melt-bonded to the surface of the ceramic substrate 1 exclusive of the metallized metal portion 2, and a fine electric wiring 4 is formed on the surface of the glazing layer 3 according to the known film-forming method.

The glazing layer 3 on the surface of the ceramic substrate 1 is composed of, for example, a glass of the $SiO_2$-$BaO$-$Al_2O_3$-$CaO$ system, and the glazing layer 3 is melt-bonded to the surface of the ceramic substrate 1 exclusive of the metallized portion 2 according to a method described below.

External pins 5 are soldered to the bottom face part of the metallized metal portion 2 of the ceramic substrate 1 through a solder such as a silver solder, and these external pins 5 consist of Kovar (Fe-Ni-Co alloy) or 42 Alloy and exert a function of electrically connecting the fine filmy electric wiring 4 to other external circuit.

The fine electric wiring 4 composed of a metal such as aluminum (Al) or copper (Cu) is formed on the surface of the glazing layer 4 so that a part of the wiring 4 is overlapped on the metallized metal portion, whereby a fine filmy electric wiring plate can be fabricated.

The method for melt-bonding the glazing layer 3 on the surface of the ceramic substrate 1 exclusive of the metallized metal portion 2 will now be described in detail.

Figure 2:
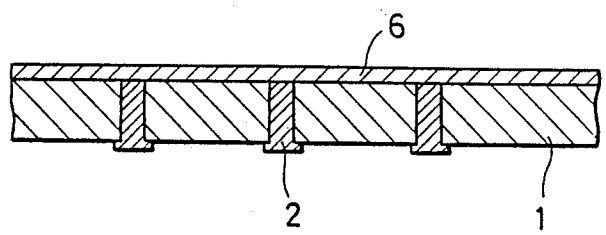
FIG. 2 is an enlarged sectional view illustrating a ceramic substrate on which a paste of a glazing composition is coated.

According to the present invention, as shown in FIG. 2, a paste 6 of a glazing composition is coated on the entire surface of the ceramic substrate 1 having the metallized metal portion. The present invention is characterized in that this glazing composition has such properties that the composition is converted into a glass under a reducing atmosphere and has a repellency to the metallized metal portion in the molten state.

A conventional glazing composition is composed of a glass powder comprising, for example, 40% by weight of $SiO_2$, 8% by weight of $Al_2O_3$, 8% by weight of CaO, 6% by weight of $B_2O_3$, 25% by weight of PbO, 8% by weight of BaO and 5% by weight of $Bi_2O_3$. This composition has a good wetting property to the metallized metal portion in the molten state. Accordingly, in the conventional method, the composition should be coated on the surface of the ceramic substrate 1 except the metallized metal portion. Moreover, this composition should be sintered and melt-bonded in an oxygen-containing atmosphere. Therefore, the conventional technique is defective in that since sintering is carried out in the open air, the metallized metal portion of the ceramic substrate is oxidized and completely extinguished.

Furthermore, if the glazing paste-coated ceramic substrate is sintered in a reducing atmosphere so as to prevent oxidation and extinguishment of the metallized metal portion, mainly PbO in the glass powder is reduced and the melt-bonded glazing layer is blackened or rendered electrically conductive, with the result that such a serious defect as loss of the function of the fine electric wiring is induced by formation of short circuits in the fine electric wiring formed on the glazing layer.

We found that a certain glazing composition can be vitrified in a reducing atmosphere without induction of the above defect and this glazing composition has a repellency to the metallized metal portion in the molten state. We have now completed the present invention based on this finding.

Any of glazing compositions having the above-mentioned properties can be optionally used in the present invention. As preferred examples, there can be mentioned a glass comprising $SiO_2$, $B_2O_3$, BaO, $Al_2O_3$ and an alkali metal oxide and a glass comprising $SiO_2$, BaO, $Al_2O_3$, CaO and MgO and/or SrO.

A glazing glass composition of the first type according to the present invention comprises 60 to 80% by weight of $SiO_2$, 10 to 25% by weight of $B_2O_3$, 2 to 10% by weight of BaO, 0.5 to 10% by weight of $Al_2O_3$ and 1 to 15% by weight of at least one alkali metal oxide.

$SiO_2$ and $B_2O_3$ used in the glazing glass composition of the present invention are main components of the glass constituting the glazing layer. If the amount added of $SiO_2$ is smaller than 60% by weight, the chemical resistance of the glazing layer is degraded, and when a chemical adheres to the glazing layer in forming a filmy electric wiring, the glazing layer is corroded and good wiring is impossible. If the amount of $SiO_2$ is larger than 80% by weight, the thermal expansion coefficient of the glazing layer becomes larger than that of the ceramic substrate, cracking or peeling is readily caused in the glazing layer.

If the amount added of $B_2O_3$ is smaller than 10% by weight, the surface of the glazing layer is crystallized and the surface roughness is increased, a fine electric wiring cannot be formed. If the amount of $B_2O_3$ is larger than 25% by weight, the water resistance of the glazing layer is degraded, the glazing layer is corroded in forming a filmy electric wiring or by water contained in air and a good electric wiring cannot be formed. Accordingly, in the present invention, the amounts added of $SiO_2$ and $B_2O_3$ are controlled to 60 to 80% by weight and 10 to 25% by weight, respectively.

BaO is a component controlling crystallization of the glazing layer and preventing reduction of the softening point. If the amount added of BaO is smaller than 2% by weight, the above effects cannot be attained, and if the amount of BaO is larger than 10% by weight, the thermal expansion coefficient of the glazing layer becomes larger than that of the ceramic substrate and cracking or peeling is readily caused in the glazing layer. Accordingly, in the present invention, the amount added of BaO is controlled to 2 to 10% by weight.

$Al_2O_3$ is a component controlling crystallization of the glazing layer. If the amount added of $Al_2O_3$ is smaller than 0.5% by weight, this effect cannot be attained, and if the amount of $Al_2O_3$ is larger than 10% by weight, the surface roughness of the glazing layer is increased and a good electric wiring cannot be formed. Therefore, in the present invention, the amount added of $Al_2O_3$ is controlled to 0.5 to 10% by weight.

An alkali metal oxide, for example, $K_2O$ or $Na_2O$, is a component adjusting the thermal expansion coefficient of the glazing layer. If the amount added of the alkali metal oxide is smaller than 1% by weight, the above effect cannot be attained, and if the amount of the alkali metal oxide is larger than 15% by weight, the thermal expansion coefficient of the glazing layer becomes larger than that of the ceramic substrate and cracking or peeling is readily caused in the glazing layer. Accordingly, the amount added of the alkali metal oxide is controlled to 1 to 15% by weight in the present invention.

A glazing glass composition of the second type according to the present invention comprises 55 to 75% by weight of $SiO_2$, 6 to 20% by weight of BaO, 6 to 12% by weight of $Al_2O_3$, 8 to 20% by weight of CaO and 0.05 to 3% by weight of at least one member selected from MgO and SrO.

$SiO_2$ used in the glazing glass composition of the present invention is a main component of a glass constituting the glazing layer. If the amount added of $SiO_2$ is smaller than 55% by weight, the chemical resistance of the glazing layer is degraded, and if a chemical adheres to the glazing layer in forming a filmy electric wiring, the glazing layer is corroded and a good electric wiring cannot be formed. If the amount added of $SiO_2$ is larger than 75% by weight, the thermal expansion coefficient of the glazing layer becomes larger than that of the ceramic substrate and cracking or peeling is readily caused in the glazing layer. Accordingly, in the present invention, the amount added of $SiO_2$ is controlled to 55 to 75% by weight.

BaO is a component controlling crystallization of the glazing layer and also controlling the thermal expansion coefficient. If the amount added of BaO is smaller than 6% by weight, the above effects cannot be attained, and if the amount of BaO is larger than 20% by weight, the thermal expansion coefficient of the glazing layer becomes larger than that of the ceramic substrate and cracking or peeling is readily caused in the glazing layer. Accordingly, in the present invention, the amount of BaO is controlled 6 to 20% by weight.

$Al_2O_3$ is a component controlling crystallization of the glazing layer and improving the chemical resistance. If the amount added of $Al_2O_3$ is smaller than 6% by weight, the above effects cannot be attained, and if the amount of $Al_2O_3$ is larger than 12% by weight, the surface roughness of the glazing layer is increased and a good electric wiring cannot be formed. Accordingly, in the present invention, the amount added of $Al_2O_3$ is controlled to 6 to 12% by weight.

CaO is a component stabilizing the electric characteristics of the glazing layer. If the amount added of CaO is smaller than 8% by weight, the above stabilizing effect cannot be attained, and if the amount added of CaO is larger than 20% by weight, the softening point of the glazing layer is drastically reduced. Accordingly, in the present invention, the amount added of CaO is controlled to 8 to 20% by weight. MgO and/or SrO is a component controlling the thermal expansion coefficient of the glazing layer. If the amount added of this component is smaller than 0.05% by weight, this effect cannot be attained, and if the amount of this component is larger than 3% by weight, the thermal expansion coefficient of the glazing layer becomes larger than that of the ceramic substrate and cracking or peeling is readily caused in the glazing layer. Accordingly, in the present invention, the amount added of MgO and/or SrO is controlled to 0.05 to 3% by weight.

The glazing composition is used in the form of a glass powder formed by blending the above-mentioned components, melting the mixture to form a homogeneous glass and pulverizing the glass. It is preferred that the particle size of the glass powder be 1 to 100 μm.

In the present invention, this powdery glazing composition is mixed with a binder and a solvent to form a paste to be coated on a ceramic substrate. In accordance with a preferred embodiment of the present invention, an acrylic acid resin syrup, especially an isobutyl merthacrylate resin syrup, is used as the binder.

As the glazing composition paste, there has been used a paste formed by adding a binder such as ethyl cellulose or nitro cellulose and a solvent such as isoamyl acetate or ethyl cellosolve. However, if this paste coating layer is sintered in a reducing atmosphere to melt-bond a glazing layer to the ceramic substrate, since the temperature at which the binder is decomposed and scattered is higher than the softening point of the glass composition and the binder is not oxidized but carburized, carbon is included in the glazing layer and a defect of blackening of the glazing layer is induced.

We made research with a view to overcoming this defect, and as the result, it was found that when an isobutyl methacrylate resin syrup, which is decomposed and scattered at a temperature lower than the softening point of the glass composition, is used as the binder of the paste, the printability of the glazing paste is highly improved and even if sintering is carried out in a reducing atmosphere in melt-bonding the glazing layer to the surface of the ceramic substrate, the isobutyl methacrylate resin syrup as the binder is decomposed and scattered before the glass composition is softened, with the result that carburization and subsequent inclusion of carbon into the glazing layer are not caused and blackening of the glazing layer is effectively prevented.

By the term "acrylic resin syrup" is meant a syrup-like liquid having a high viscosity, which is a composition comprising an acrylic resin prepolymer and an acrylic monomer. As the acrylic monomer, there can be mentioned methyl methacrylate, ethyl acrylate butyl acrylate in addition to the above-mentioned isobutyl methacrylate. The resin syrup can be prepared by adding a small amount of a radical polymerization initiator to an acrylic monomer as mentioned above and carrying out preliminary polymerization. It is preferred that the preliminary polymerization be conducted so that the polymerization ratio is 10 to 40%.

It is preferred that the paste should comprise 40 to 70% by weight of the powdery glazing composition, 5 to 20% by weight of the binder and 10 to 55% by weight of the solvent. The kind of the solvent is not particularly critical, but α-terpineol is especially suitable.

The paste coating method is not particularly critical, but there may be optionally adopted the roller coating method, the wire coating method and the spray coating method. Ordinarily, it is preferred that printing and coating be performed according to the screen printing method. The amount coated of the paste is such that a glazing layer having an average thickness of 10 to 150 μm is formed on the surface of the ceramic substrate.

Figure 3:
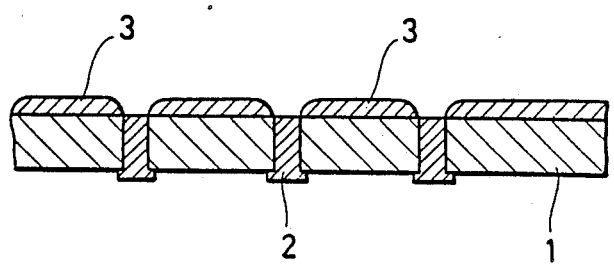
FIG. 3 is an enlarged sectional view illustrating a glazed ceramic substrate obtained by sintering the substrate shown in FIG. 2.

The glazing paste-coated ceramic substrate is sintered at a temperature of 900° to 1400° C. in a reducing atmosphere, for example, a nitrogen hydrogen atmosphere to scatter the binder and solvent contained in the glazing paste and melt the powdery glass composition, whereby the glass composition is melt-bonded to the surface of the ceramic substrate. Thus, formation of a glazing layer on the ceramic substrate by metal bonding is completed. In the present invention, although the glazing paste is coated on the entire surface of the ceramic substrate 1, since the molten glass formed in the reducing atmosphere is composed of oxides having a very poor wetting property to the metallized metal portion 2, as shown in FIG. 3, the melt present on the metallized metal portion can be transferred to the surface of the ceramic substrate, and the molten glass flows only on the surface of the ceramic substrate exclusive of the metallized metal portion 2 and a glazing layer is melt-bonded only to the surface of the ceramic substrate exclusive of the metallized metal portion 2. Therefore, a mask for coating the glazing paste on the surface of the ceramic substrate exclusive of the metallized metal portion need not be used at all, hand the method is very excellent in the productivity. Moreover, since the glazing layer 3 is melt-bonded to the surface of the ceramic substrate 1 even to the point very close to the metallized metal portion 2, even when a fine filmy electric wiring 4 is formed on the surface of the glazing layer 3, breakage of the fine filmy electric wiring 4, which is due to the surface roughness of the ceramic substrate 1, is not caused at all.

If the coating thickness of the glazing paste on the ceramic substrate 1 is adjusted to less than 50 μm, when sintering is carried out in a reducing atmosphere, migration of the molten glass to the surface of the ceramic substrate from the metallized metal portion is advanced very smoothly. Accordingly, it is preferred that the glazing paste be printed and coated in a thickness of less than 50 μm.

Since molybdenum (Mo) or tungsten (W) has a strong affinity with oxygen, it couples with oxygen of the molten glass and migration of the molten metal to the surface of the ceramic substrate from the metallized metal portion becomes unstable. Accordingly, if a layer composed of at least one metal selected from nickel, gold, platinum, palladium and rhodium having a low affinity with oxygen is formed on the surface of the metallized metal portion, migration of the molten glass to the surface of the ceramic substrate from the metallized metal portion can be performed assuredly. Therefore, it is preferred that a layer composed of at least one metal selected from nickel, gold, platinum, palladium and rhodium be formed on the surface of the metallized metal portion.

As is apparent from the foregoing description, according to the process of the present invention, only by coating the glazing paste on the entire surface of the ceramic substrate inclusive of the metallized metal portion and sintering the paste-coated ceramic substrate in a reducing atmosphere to transfer the glazing paste present on the metallized metal portion to the surface of the ceramic substrate from the metal portion, the glazing layer can be melt-bonded substantially to the entire surface of the ceramic substrate exclusive of the metal portion, and breakage of a fine filmy electric wiring portion formed on the glazing layer can be completely prevented in the obtained glazed ceramic substrate.

Furthermore, a special mask for coating a glazing pste only on the surface of the ceramic substrate exclusive of the metallized metal portion need not be used at all and poor productivity owing to the use of this mask is overcome. Therefore, according to the present invention, the productivity is highly improved and the manufacturing cost of a glazed ceramic substrate can be greatly reduced.

Incidentally, the present invention is not limited to the embodiments described hereinbefore, but various modifications can be made without departing from the scope of the present invention.

The present invention will now be described in detail with reference to the following examples that by no means limit the scope of the invention.

EXAMPLE 1

$SiO_2$, $B_3O_3$, BaO, $Al_2O_3$ and an alkali metal oxide ($K_2O$, $Na_2O$ or $Li_2O$) as starting materials were weighed and mixed in such amounts as producing a chemical composition shown below, and the mixture was heated and molten at about 1400° C. in air to form a glass.

Methanol was added to the glass and wet pulverization was carried out by using a ball mill. The pulverized glass was dried and passed through a 200-mesh sieve. Then, an isobutyl methacrylate resin syrup and α-terpineol were added to the glass powder and the mixture was kneaded for 1 hour by a crusher to obtain a sample of a glazing paste.

Incidentally, sample 26 is a comparative sample of a conventional glazing paste comprising 40% by weight of $SiO_2$, 8% by weight of $Al_2O_3$, 8% by weight of CaO, 6% by weight of $B_2O_3$, 25% by weight of PbO, 8% by weight of BaO and 5% by weight of $Bi_2O_3$.

By using the so-obtained glazing paste, 100 patterns having a length of 5 mm, a width of 5 mm and a thickness of 100 μm were formed on a square alumina substrate having a side of 100 mm, and sintering was carried out at about 1200° C. in a reducing atmosphere (nitrogen-hydrogen atmosphere) to form a glazing layer on the surface of the ceramic substrate by melt bonding. The ceramic substrate having the glazing layer melt-bonded thereto was immersed in water and an alkaline solution, and the surface of the glazing layer was observed by a microscope to examine the surface condition of the glazing layer. Simultaneously, the number of the blackened patterns was counted and the discoloration ratio was calculated. Furthermore, the surface roughness of the glazing layer was measured by a surface roughness meter and the average value was calculated.

The above procedures were repeated in the same manner except that a metallized metal portion was formed by embedding molybdenum (Mo) and the glazing paste was coated in a thickness of 30 μm, followed by sintering and metal bonding. The repellency to the metallized metal portion was examined.

The obtained results are shown in Table 1.

TABLE 1

| Sample No. | Glazing Glass Composition (% by weight) | | | | Alkali Metal Oxide | | | Blackening of Glazing Layer Discoloration Ratio (%) | Surface Roughness Rmax (μm) | Surface Condition of Glazing Layer | Repellency to Metallizing Metal Portion |
|---|---|---|---|---|---|---|---|---|---|---|---|
| | $SiO_2$ | $B_2O_3$ | BaO | $Al_2O_3$ | $K_2O$ | $Na_2O$ | $Li_2O$ | | | | |
| *1 | 55.0 | 15.0 | 5.0 | 5.0 | 10.0 | 10.0 | 0 | 100 | 2.5 | dissolution of glazing layer in alkaline solution, blackening of glazing layer by carbon formed from binder | excellent |
| *2 | 60.0 | 7.5 | 10.0 | 10.0 | 7.5 | 0 | 5.0 | 78 | 3.0 | crystallization of surface, increase of surface roughness, blackening of glazing layer by carbon formed from binder | excellent |
| 3 | 60.0 | 10.0 | 9.0 | 8.0 | 8.0 | 2.5 | 2.5 | 10 | 0.4 | good | " |
| 4 | 60.0 | 15.0 | 8.0 | 8.0 | 9.0 | 0 | 0 | 12 | 0.4 | good | " |
| 5 | 60.0 | 20.0 | 7.0 | 7.0 | 0 | 3.0 | 3.0 | 8 | 0.3 | good | " |
| 6 | 60.0 | 25.0 | 6.0 | 5.0 | 4.0 | 0 | 0 | 2 | 0.2 | good | " |
| 7 | 60.0 | 25.0 | 3.0 | 5.0 | 3.5 | 0 | 3.5 | 6 | 0.4 | good | " |
| *8 | 60.0 | 25.0 | 1.0 | 9.0 | 5.0 | 0 | 0 | 1 | 3.0 | crystallization of surface and increase of surface roughness | " |
| *9 | 60.0 | 10.0 | 3.0 | 15.0 | 0 | 7.0 | 5.0 | 11 | 4.5 | increase of surface roughness | " |
| *10 | 60.0 | 30.0 | 4.0 | 3.0 | 1.5 | 1.5 | 0 | 3 | 1.0 | corrosion of glazing layer by water | " |
| *11 | 65.0 | 15.0 | 15.0 | 3.0 | 0 | 0 | 2.0 | 0 | 2.4 | many cracks in glazing layer | " |
| 12 | 65.0 | 10.0 | 10.0 | 10.0 | 3.0 | 1.0 | 1.0 | 0 | 0.4 | good | " |
| 13 | 65.0 | 15.0 | 8.0 | 7.0 | 5.0 | 0 | 0 | 0 | 0.3 | good | " |
| 14 | 65.0 | 20.0 | 5.0 | 5.0 | 2.5 | 2.5 | 0 | 0 | 0.4 | good | excellent |
| 15 | 65.0 | 25.0 | 5.0 | 3.0 | 0 | 0 | 2.0 | 0 | 0.3 | good | " |
| 16 | 70.0 | 10.0 | 8.0 | 8.0 | 0 | 2.0 | 2.0 | 0 | 0.3 | good | " |
| 17 | 70.0 | 15.0 | 6.0 | 6.0 | 3.0 | 0 | 0 | 0 | 0.4 | good | " |
| 18 | 70.0 | 20.0 | 5.0 | 3.0 | 1.0 | 1.0 | 0 | 0 | 0.3 | good | " |
| 19 | 70.0 | 25.0 | 3.0 | 1.0 | 0 | 1.0 | 0 | 0 | 0.4 | good | " |
| 20 | 75.0 | 10.0 | 7.0 | 7.0 | 0.5 | 0.5 | 0 | 0 | 0.3 | good | " |
| 21 | 75.0 | 15.0 | 5.0 | 3.0 | 2.0 | 0 | 0 | 0 | 0.4 | good | " |
| 22 | 75.0 | 20.0 | 3.0 | 1.0 | 0 | 0 | 1.0 | 0 | 0.3 | good | " |
| 23 | 80.0 | 10.0 | 7.0 | 1.0 | 0 | 1.0 | 1.0 | 0 | 0.4 | good | " |
| 24 | 80.0 | 15.0 | 3.0 | 1.0 | 1.0 | 0 | 0 | 0 | 0.4 | good | " |
| *25 | 85.0 | 10.0 | 3.5 | 2.0 | 0.5 | 0 | 0 | 0 | 3.0 | many cracks in glazing layer | " |
| 26 (conventional product) | $SiO_2$ 40 wt %, $Al_2O_3$ 8 wt %, CaO 8 wt %, $B_2O_3$ 6 wt %, PbO 25 wt %, BaO 8 wt %, $Bi_2O_3$ 5 wt % | | | | | | | 100 | 0.9 | increase of surface roughness by presence of Pb particles, increased blackening of glazing layer by pressure of Pb particles | bad |

Note
*outside the scope of the present invention

The electric insulation resistance of the glazing layer was measured by an electric resistance meter and the average value was calculated to examine the reduction of the electric insulation resistance as compared with the electric insulation resistance of the glass powder in the glazing paste.

The obtained results are shown in Table 2.

TABLE 2

| Sample No. | Electric Insulation Resistance (Ω-cm) | |
|---|---|---|
| | glass in glazing paste | glazing layer |
| *1 | $2.4 \times 10^{13}$ | $1.4 \times 10^{11}$ |
| *2 | $3.1 \times 10^{13}$ | $3.1 \times 10^{12}$ |
| 3 | $3.8 \times 10^{13}$ | $1.1 \times 10^{13}$ |
| 4 | $3.9 \times 10^{13}$ | $3.4 \times 10^{13}$ |
| 5 | $4.1 \times 10^{13}$ | $3.1 \times 10^{13}$ |
| 6 | $7.1 \times 10^{13}$ | $5.1 \times 10^{13}$ |
| 7 | $3.5 \times 10^{13}$ | $2.4 \times 10^{13}$ |
| *8 | $8.4 \times 10^{13}$ | $7.1 \times 10^{13}$ |
| *9 | $7.0 \times 10^{13}$ | $6.0 \times 10^{13}$ |
| *10 | $2.2 \times 10^{13}$ | $1.3 \times 10^{13}$ |
| *11 | $3.3 \times 10^{13}$ | $1.0 \times 10^{13}$ |
| 12 | $2.8 \times 10^{13}$ | $2.5 \times 10^{13}$ |
| 13 | $3.4 \times 10^{13}$ | $3.2 \times 10^{13}$ |
| 14 | $4.0 \times 10^{13}$ | $3.4 \times 10^{13}$ |
| 15 | $6.9 \times 10^{13}$ | $6.2 \times 10^{13}$ |
| 16 | $6.1 \times 10^{13}$ | $5.1 \times 10^{13}$ |
| 17 | $4.7 \times 10^{13}$ | $4.1 \times 10^{13}$ |
| 18 | $5.2 \times 10^{13}$ | $4.5 \times 10^{13}$ |
| 19 | $8.8 \times 10^{13}$ | $8.4 \times 10^{13}$ |
| 20 | $9.7 \times 10^{13}$ | $9.2 \times 10^{13}$ |
| 21 | $9.1 \times 10^{13}$ | $8.3 \times 10^{13}$ |
| 22 | $9.9 \times 10^{13}$ | $9.4 \times 10^{13}$ |
| 23 | $9.4 \times 10^{13}$ | $9.2 \times 10^{13}$ |
| 24 | $9.8 \times 10^{13}$ | $9.7 \times 10^{13}$ |
| *25 | $2.8 \times 10^{14}$ | $2.1 \times 10^{14}$ |
| 26 | $6.2 \times 10^{13}$ | $8.4 \times 10^{8}$ |

Note
*outside the scope of the present invention

As is apparent from the foregoing results, in case of the conventional glazing glass composition, all of the patterns of the glazing layer were blackened and the electric insulation resistance was greatly reduced to $8.4 \times 10^8$ Ω-cm from $6.2 \times 10^{13}$ Ω-cm. In contrast, when the glazing glass composition of the present invention was used, the blackening ratio was lower than 12%, and the reduction of the electric insulation resistance was very small. Moreover, the repellency to the metallized metal portion was excellent.

Accordingly, it is seen that the glazing glass composition of the present invention is very valuable as a material of a glazing layer to be melt-bonded to the surface of a ceramic substrate having a metallized metal portion.

EXAMPLE 2

$SiO_2$, BaO, $Al_2O_3$, CaO, MgO and SrO as the starting materials were weighed and mixed in such amounts as producing a chemical composition shown below, and the mixture was heated and molten at about 1400° C. in air to form a glass.

Methanol was added to the glass and wet pulverization was carried out by using a ball mill, and the pulverized glass was dried and passed through a 200-mesh sieve.

An isobutyl methacrylate resin syrup and α-terpineol were added to the glass powder, and the mixture was kneaded for 1 hour by a crusher to obtain a sample of a glazing paste.

Incidentally, sample 25 is a comparative sample of a conventional glazing paste comprising 40% by weight of $SiO_2$, 8% by weight of $Al_2O_3$, 8% by weight of CaO, 6% by weight of $B_2O_3$, 25% by weight of PbO, 8% by weight of BaO and 5% by weight of $Bi_2O_3$.

By using the so-obtained glazing paste, 100 patterns having a length of 5 mm, a width of 5 mm and a thickness of 100 μm were formed on a square alumina substrate having a side of 100 mm, and sintering was carried out at about 1200° C. in a reducing atmosphere (nitrogen-hydrogen atmosphere) to form a glazing layer on the surface of the ceramic substrate by melt bonding: The ceramic substrate having the glazing layer melt-bonded thereto was immersed in an alkaline solution, and the surface of the glazing layer was observed by a microscope to examine the surface conditions of the glazing layer. Simultaneously, the number of the blackened patterns was counted and the discoloration ratio was calculated. Furthermore, the surface roughness of the glazing layer was measured by a surface roughness meter and the average value was calculated.

The repellency to the metallized metal portion was examined in the same manner as described in Example 1.

The obtained results were shown in Table 3.

TABLE 3

| Sample No. | Glazing Glass Composition (% by weight) | | | | | | Blackening of Glazing Layer Discoloration Ratio (%) | Surface Roughness Rmax (μm) | Surface Condition of Glazing Layer | Repellency to Metallized Metal Portion |
|---|---|---|---|---|---|---|---|---|---|---|
| | $SiO_2$ | BaO | $Al_2O_3$ | CaO | MgO | SrO | | | | |
| *1 | 50.0 | 15.0 | 8.0 | 25.0 | 2.0 | 0 | 100 | 0.3 | dissolution of glazing layer in alkaline solution, blackening of glazing layer by presence of carbon formed from binder | excellent |
| 2 | 55.0 | 10.0 | 12.0 | 20.0 | 0 | 3.0 | 0 | 0.3 | good | " |
| 3 | 55.0 | 15.0 | 10.0 | 18.0 | 1.0 | 1.0 | 0 | 0.3 | good | " |
| 4 | 55.0 | 18.0 | 7.5 | 19.0 | 0 | 0.5 | 0 | 0.4 | good | " |
| 5 | 55.0 | 20.0 | 6.0 | 18.9 | 0.1 | 0 | 0 | 0.4 | good | " |
| *6 | 60.0 | 5.0 | 12.0 | 20.0 | 0 | 3.0 | 0 | 2.1 | many cracks in glazing layer | " |
| *7 | 60.0 | 6.0 | 15.0 | 18.0 | 0.5 | 0.5 | 0 | 2.8 | increased surface roughness | " |
| 8 | 60.0 | 10.0 | 12.0 | 16.0 | 1.0 | 1.0 | 0 | 0.3 | good | " |
| 9 | 60.0 | 15.0 | 10.0 | 14.0 | 0.5 | 0.5 | 0 | 0.2 | good | " |
| 10 | 60.0 | 18.0 | 10.0 | 11.5 | 0.5 | 0 | 0 | 0.3 | good | " |
| 11 | 60.0 | 20.0 | 8.0 | 11.9 | 0 | 0.1 | 0 | 0.3 | good | " |
| *12 | 60.0 | 25.0 | 6.8 | 8.0 | 0.1 | 0.1 | 0 | 0.3 | many cracks in glazing layer | " |
| 13 | 65.0 | 10.0 | 12.0 | 10.0 | 1.5 | 1.5 | 0 | 0.4 | good | " |
| 14 | 65.0 | 15.0 | 10.0 | 8.0 | 0 | 2.0 | 0 | 0.4 | good | " |
| 15 | 65.0 | 18.0 | 7.0 | 8.0 | 2.0 | 0 | 0.3 | good | " | |
| *16 | 65.0 | 13.0 | 5.0 | 15.0 | 2.0 | 0 | 3 | 1.3 | crystallization of surface, increased surface roughness | excellent |
| *17 | 65.0 | 8.0 | 8.0 | 14.0 | 2.5 | 2.5 | 0 | 1.8 | many cracks in glazing layer | " |
| 18 | 70.0 | 6.0 | 12.0 | 11.0 | 0.5 | 0.5 | 0 | 0.3 | good | " |
| 19 | 70.0 | 10.0 | 6.0 | 13.0 | 1.0 | 0 | 0 | 0.3 | good | " |
| 20 | 70.0 | 15.0 | 6.75 | 8.0 | 0.25 | 0 | 0 | 0.3 | good | " |
| 21 | 75.0 | 6.0 | 6.0 | 0 | 3.0 | 0 | 0.4 | good | " | |
| 22 | 75.0 | 8.0 | 7.0 | 9.0 | 0.5 | 0.5 | 0 | 0.4 | good | " |
| *23 | 75.0 | 10.0 | 9.0 | 5.0 | 0.5 | 0.5 | 0 | 0.3 | good | " |
| *24 | 80.0 | 6.0 | 6.0 | 8.0 | 0 | 0 | 0 | 1.9 | many cracks in glazing layer | " |
| 25 (conventional product) | $SiO_2$ 40 wt %, $Al_2O_3$ 8 wt %, $B_2O_3$ 6 wt %, CaO 8 wt %, PbO 25 wt %, BaO 8 wt %, $Bi_2O_3$ 5 wt % | | | | | | 100 | 0.9 | increase of surface roughness by presence of Pb particles and increased blackening by presence of Pb particles | bad |

Note
*outside the scope of the present invention

The electric insulation resistance of the glazing layer was measured by an electric resistance meter and the average value was calculated to examine the reduction of the electric insulation resistance as compared with the electric insulation resistance of the glass powder in the glazing paste.

The obtained results are shown in Table 4.

TABLE 4

| Sample No | Electric Insulation Resistance (Ω-cm) | |
|---|---|---|
| | glass in glazing paste | glazing layer |
| *1 | $5.1 \times 10^{13}$ | $4.2 \times 10^{13}$ |
| 2 | $4.3 \times 10^{13}$ | $3.9 \times 10^{13}$ |
| 3 | $2.8 \times 10^{13}$ | $2.3 \times 10^{13}$ |
| 4 | $5.2 \times 10^{13}$ | $5.1 \times 10^{13}$ |
| 5 | $6.0 \times 10^{13}$ | $5.6 \times 10^{13}$ |
| *6 | $7.5 \times 10^{13}$ | $7.1 \times 10^{13}$ |
| *7 | $4.9 \times 10^{13}$ | $4.8 \times 10^{13}$ |
| 8 | $4.5 \times 10^{13}$ | $4.1 \times 10^{13}$ |
| 9 | $5.8 \times 10^{13}$ | $5.4 \times 10^{13}$ |
| 10 | $5.4 \times 10^{13}$ | $4.9 \times 10^{13}$ |
| 11 | $6.9 \times 10^{13}$ | $6.2 \times 10^{13}$ |
| *12 | $8.1 \times 10^{13}$ | $7.2 \times 10^{13}$ |

TABLE 4-continued

| Sample No | Electric Insulation Resistance ($\Omega$-cm) | |
|---|---|---|
| | glass in glazing paste | glazing layer |
| 13 | $6.7 \times 10^{13}$ | $6.3 \times 10^{13}$ |
| 14 | $6.2 \times 10^{13}$ | $5.4 \times 10^{13}$ |
| 15 | $6.4 \times 10^{13}$ | $5.8 \times 10^{13}$ |
| *16 | $6.5 \times 10^{13}$ | $6.0 \times 10^{13}$ |
| *17 | $9.9 \times 10^{13}$ | $9.1 \times 10^{13}$ |
| 18 | $8.0 \times 10^{13}$ | $7.4 \times 10^{13}$ |
| 19 | $9.4 \times 10^{13}$ | $8.5 \times 10^{13}$ |
| 20 | $8.3 \times 10^{13}$ | $8.1 \times 10^{13}$ |
| 21 | $8.4 \times 10^{13}$ | $6.8 \times 10^{13}$ |
| 22 | $5.1 \times 10^{13}$ | $4.1 \times 10^{13}$ |
| *23 | $3.0 \times 10^{9}$ | $2.1 \times 10^{9}$ |
| *24 | $9.1 \times 10^{13}$ | $8.4 \times 10^{13}$ |
| 25 | $6.2 \times 10^{13}$ | $8.4 \times 10^{8}$ |

Note
*outside the scope of the present invention

As is apparent from the foregoing results, in case of the conventional glazing glass composition, all of the patterns of the glazing layer were blackened and the electric insulation resistance was greatly reduced to $8.4 \times 10^{8}$ $\Omega$-cm from $6.2 \times 10^{-}\Omega$-cm. In contrast, when the glazing glass composition of the present invention, blackening was not caused at all, and the reduction of the electric insulation resistance was very small. Moreover, the repellency to the metallized metal portion was excellent.

Accordingly, it is seen that the glazing glass composition of the present invention is very valuable as a material of a glazing layer to be melt-bonded to the surface of a ceramic substrate having a metallized metal portion.

EXAMPLE 3

A mixture comprising 65.0% by weight of $SiO_2$, 15.0% by weight of BaO, 8.0% by weight of CaO, 10.0% by weight of $Al_2O_3$ and 2.0% by weight of SrO was heated and molten at about 1400° C. to form a glazing glass, and the glass was wet-pulverized by a ball mill, dried and passed through a 200-mesh sieve. An isobutyl methacrylate resin syrup as the binder was incorporated in an amount shown below into α-terpineol (solvent) and the mixture was added to the glass powder, and the mixture was kneaded for 1 hour in a crusher to form a sample of a glazing paste.

Incidentally, samples 9 and 10 are comparative samples of conventional glazing pastes comprising as the binder ethyl cellulose and nitro cellulose, respectively.

By using the so-obtained glazing paste, 50 patterns having a length of 5 mm, a width of 5 mm and a thickness of 100 μm were formed on square alumina substrate having a side of 100 mm by printing through an 80-mesh screen, and the printed ceramic substrate was sintered at about 1200° C. in a reducing atmosphere (nitrogen-hydrogen atmosphere) to form a glazing layer on the surface of the ceramic substrate by melt bonding. The glazing layer was examined by a microscope to examine bleeding of the glazing layer, and the number of the blackened patterns of the glazing layer was counted and the discoloration ratio was calculated.

The obtained results are shown in Table 5.

TABLE 5

| Sample No. | Amount (% by weight of Isobutyl Methacrylate Resin Syrup | Blackening of Glazing Layer Discoloration Ratio (%) | Surface Condition of Glazing Layer |
|---|---|---|---|
| 1 | 1 | 0 | small bleeding of glazing layer |
| 2 | 3 | 0 | small bleeding of glazing layer |
| 3 | 5 | 0 | no bleeding |
| 4 | 8 | 0 | no bleeding |
| 5 | 10 | 0 | no bleeding |
| 6 | 15 | 0 | no bleeding |
| 7 | 20 | 0 | no bleeding |
| 8 | 25 | 4 | no bleeding |
| 9 (conventional product) | 15% by weight of ethyl cellulose | 100 | no bleeding |
| 10 (conventional product) | 15% by weight of nitro cellulose | 100 | no bleeding |

As is apparent from the foregoing experimental results, in case of the conventional glazing paste comprising ethyl cellulose or nitro cellulose as the binder, all the patterns of the glazing layer were blackened, but in case of the glazing paste of the present invention comprising an isobutyl methacrylate resin syrup as the binder, blackening was hardly caused and no substantial bleeding was observed in the glazing layer. Accordingly, it is understood that the glazing paste of the present invention is very excellent in the printability. Especially, if the amount added of the isobutyl methacrylate is adjusted to 5 to 20% by weight, blackening of the glazing layer is completely prevented and the printability of the glazing paste is highly improved.

Accordingly, it is seen that the glazing paste of the present invention is very valuable as a material of a glazing layer to be melt-bonded to the surface of a ceramic substrate having a metallized metal portion.

We claim:

1. A glazed ceramic substrate for electrical wiring, comprising:

a ceramic substrate having holes formed therethrough;

a metal composition embedded in the holes of the ceramic substrate, the metal composition providing an electrical connection to the electrical wiring; and a glazing layer melt-bonded to a surface of the ceramic substrate exclusive of the metal composition, the glazing layer providing a surface on which the electrical wiring may be formed, the glazing being repellent to the metal composition when the glazing layer is melted, wherein the glazing layer is formed from a composition consisting essentially of 55 to 75% by weight of $SiO_2$, 6 to 20% by weight of BaO, 6 to 12% by weight of $Al_2O_3$, 8 to 20% by weight of CaO and 0.05 to 3% by weight of at least one oxide selected from the group consisting of MgO and SrO, said glazing layer composition is coated over the surface of said ceramic substrate inclusive of said metal composition, and said glazing layer composition is then melted under a reducing atmosphere, whereby said glazing layer is melt-bonded to said ceramic substrate but repelled from said metal composition.

2. A substrate according to claim 1, wherein the glazing layer has an average thickness of 10 to 150 microns.

3. A substrate according to claim 1, wherein said metal composition comprises molybdenum or tungsten.

4. A substrate according to claim 3, wherein a layer comprising at least one metal selected from the group consisting of nickel, gold, platinum, palladium and rhodium is provided on a surface of said molybdenum or tungsten.

* * * * *